(12) United States Patent
Yang et al.

(10) Patent No.: US 9,166,168 B2
(45) Date of Patent: Oct. 20, 2015

(54) ORGANIC SEMICONDUCTOR POLYMER, ORGANIC THIN FILM TRANSISTOR, AND ELECTRONIC DEVICE

(71) Applicant: Samsung Electronics Co., Ltd., Suwon-Si, Gyeonggi-Do (KR)

(72) Inventors: Hye Yeon Yang, Yongin-si (KR); Bang Lin Lee, Suwon-si (KR); Bon Won Koo, Suwon-si (KR); Joo Young Kim, Hwaseong-si (KR); Jeong Il Park, Seongnam-si (KR); Eun Kyung Lee, Seoul (KR); Ji Youl Lee, Seoul (KR); Jong Won Chung, Hwaseong-si (KR); Ji Young Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/134,651

(22) Filed: Dec. 19, 2013

(65) Prior Publication Data
US 2014/0175414 A1 Jun. 26, 2014

(30) Foreign Application Priority Data

Dec. 24, 2012 (KR) .................. 10-2012-0152154
Nov. 29, 2013 (KR) .................. 10-2013-0147627

(51) Int. Cl.
*C08G 14/10* (2006.01)
*H01L 51/00* (2006.01)
*C08L 65/00* (2006.01)
*H01L 51/05* (2006.01)

(52) U.S. Cl.
CPC ............. *H01L 51/0036* (2013.01); *C08L 65/00* (2013.01); *H01L 51/0043* (2013.01);
(Continued)

(58) Field of Classification Search
CPC ................... C08G 2261/3246; C08G 2261/95; C08G 61/126; H01L 51/0558

USPC ............ 528/163, 216, 117, 54, 94, 377, 380; 257/40

See application file for complete search history.

(56) References Cited

U.S. PATENT DOCUMENTS 8,154,016 B2 4/2012 Lee et al.
2011/0004004 A1* 1/2011 Hao et al. ...................... 548/453
(Continued)

FOREIGN PATENT DOCUMENTS

WO WO-2010049321 A1 5/2010

*Primary Examiner* — Shane Fang
(74) *Attorney, Agent, or Firm* — Harness, Dickey & Pierce, P.L.C.

(57) ABSTRACT

An organic semiconductor polymer includes a moiety represented by the following Chemical Formula 1 and a heteroaromatic moiety having at least one of sulfur (S) and selenium (Se).

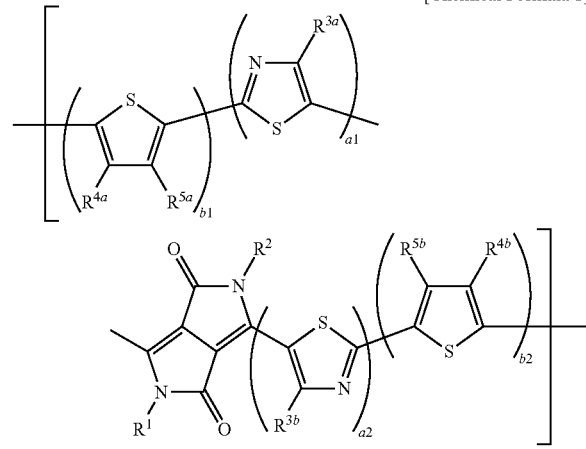

[Chemical Formula 1]

In the Chemical Formula 1, $R^1$, $R^2$, $R^{3a}$, $R^{3b}$, $R^{4a}$, $R^{4b}$, $R^{5a}$, and $R^{5b}$, a1, a2, b1, and b2 are the same as described in the detailed description.

20 Claims, 1 Drawing Sheet

(52) U.S. Cl.
CPC  *C08G2261/1412* (2013.01); *C08G 2261/3223* (2013.01); *C08G 2261/3229* (2013.01); *C08G 2261/3246* (2013.01); *C08G 2261/344* (2013.01); *C08G 2261/364* (2013.01); *C08G 2261/90* (2013.01); *C08G 2261/92* (2013.01); *C08G 2261/94* (2013.01); *H01L 51/0545* (2013.01); *Y02E 10/549* (2013.01)

(56) References Cited

U.S. PATENT DOCUMENTS

2011/0209762 A1* 9/2011 Lee et al. .................. 136/263
2011/0215313 A1* 9/2011 Duggeli et al. ............. 257/40
2011/0240981 A1* 10/2011 Duggeli et al. ............. 257/40

* cited by examiner

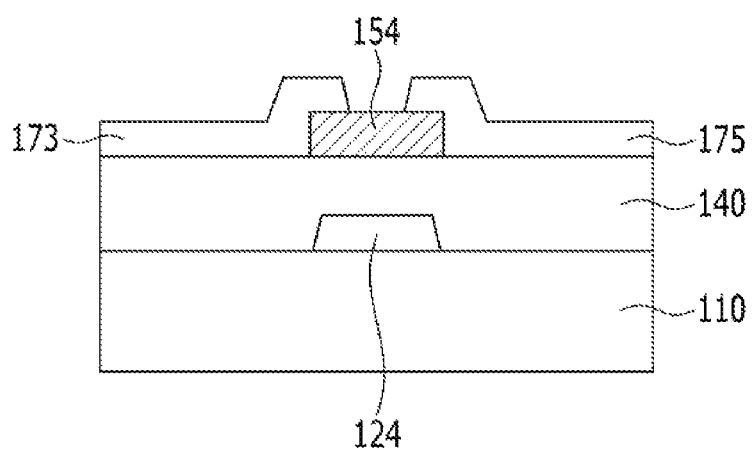

ORGANIC SEMICONDUCTOR POLYMER, ORGANIC THIN FILM TRANSISTOR, AND ELECTRONIC DEVICE

CROSS-REFERENCE TO RELATED APPLICATIONS

This application claims priority to and the benefit of Korean Patent Application Nos. 10-2012-0152154 and 10-2013-0147627 filed in the Korean Intellectual Property Office on Dec. 24, 2012 and Nov. 29, 2013, respectively, the entire contents of each of which are incorporated herein by reference.

BACKGROUND

1. Field

Example embodiments provide an organic semiconductor polymer, an organic thin film transistor, and an electronic device.

2. Description of the Related Art

A flat panel display, e.g., a liquid crystal display (LCD), an organic light emitting diode (OLED) display, or an electrophoretic display, includes multiple pairs of field generating electrodes and an electro-optical active layer interposed therebetween. The liquid crystal display (LCD) includes an electro-optical active layer of a liquid crystal layer, and the organic light emitting diode (OLED) display includes an electro-optical active layer of an organic emission layer.

One of paired field generating electrodes is generally connected to a switching element and applied with an electrical signal, and the electro-optical active layer transforms the electrical signal to an optical signal to display an image.

The flat panel display includes a three-terminal element of a thin film transistor (TFT) as a switching element, and it also includes a gate line transferring a scan signal for controlling the thin film transistor and a data line transferring a data signal to be applied to a pixel electrode.

Among the thin film transistors, an organic thin film transistor (OTFT) including an organic semiconductor, e.g., a low molecule or a polymer, instead of the inorganic semiconductor, e.g., silicon (Si), has been researched.

The organic thin film transistor may be shaped in a fiber or a film form according to the organic material characteristic, and so has drawn attention as a core element for a flexible display device. The organic thin film transistor may be manufactured using a solution process, e.g., inkjet printing, and may be more easily applied to a large area flat panel display where a deposition process has a limit.

SUMMARY

Example embodiments provide an organic semiconductor polymer having improved charge mobility and being applicable to a solution process.

Example embodiments also provide an organic thin film transistor including the organic semiconductor polymer.

Example embodiments also provide an electronic device including the organic thin film transistor.

According to example embodiments, an organic semiconductor polymer includes a moiety represented by the following Chemical Formula 1 and a heteroaromatic moiety having at least one of sulfur (S) and selenium (Se).

[Chemical Formula 1]

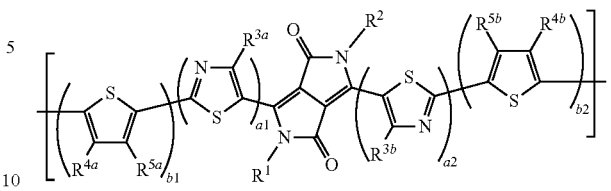

In the Chemical Formula 1, each of $R^1$, $R^2$, $R^{3a}$, $R^{3b}$, $R^{4a}$, $R^{4b}$, $R^{5a}$, and $R^{5b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of a1 and a2 are independently integers ranging from 1 to 5, and each of b1 and b2 are independently integers ranging from 1 to 10.

The heteroaromatic moiety may include at least one selected from the following Group 1.

[Group 1]

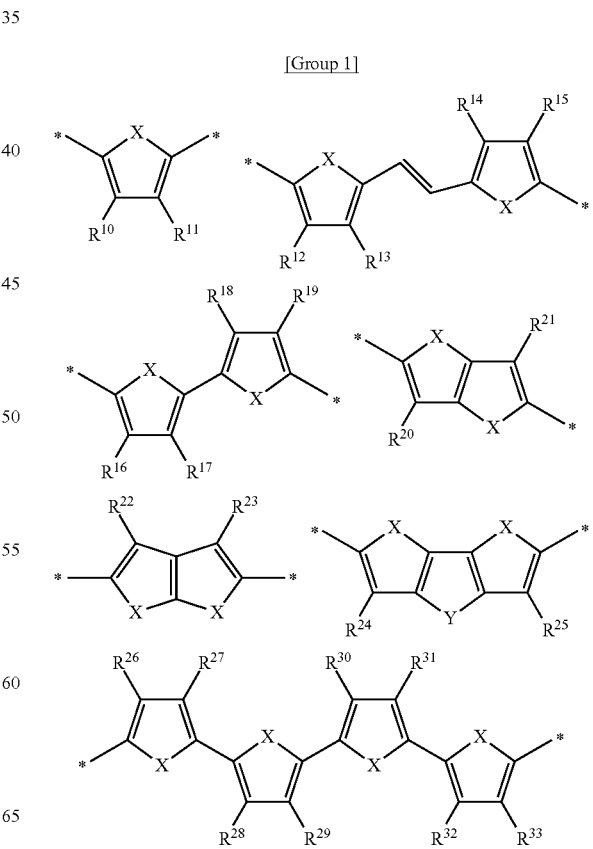

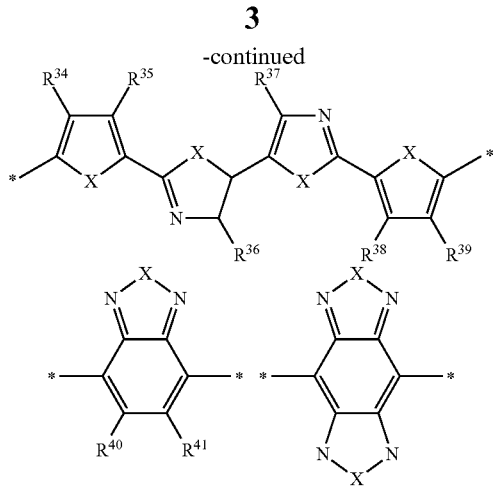

In the Group 1,

X is independently one of S and Se,

Y is one of S, Se, and $CR^aR^b$, wherein each of $R^a$ and $R^b$ are independently one of hydrogen, a substituted or unsubstituted C1 to C30 alkyl group, a halogen atom, and a combination thereof, and each of $R^{10}$ to $R^{41}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

In the Chemical Formula 1, each of $R^{4a}$ and $R^{4b}$ may independently be hydrogen, and each of $R^1$, $R^2$, $R^{3a}$, $R^{3b}$, $R^{5a}$, and $R^{5b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

The organic semiconductor polymer may be represented by the following Chemical Formula 1a.

In the Chemical Formula 1a, $Ar_1$ is a heteroaromatic moiety including at least one of sulfur (S) and selenium (Se), each of $R^{4a}$ and $R^{4b}$ may independently be hydrogen, and each of $R^1$, $R^2$, $R^{3a}$, $R^{3b}$, $R^{5a}$, and $R^{5b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

each of a1 and a2 are independently integers ranging from 1 to 5, each of b1 and b2 are independently integers ranging from 1 to 10, and m and n denote a mole ratio.

In the Chemical Formula 1a, $Ar_1$ may include at least one selected from the following Group 1.

[Group 1]

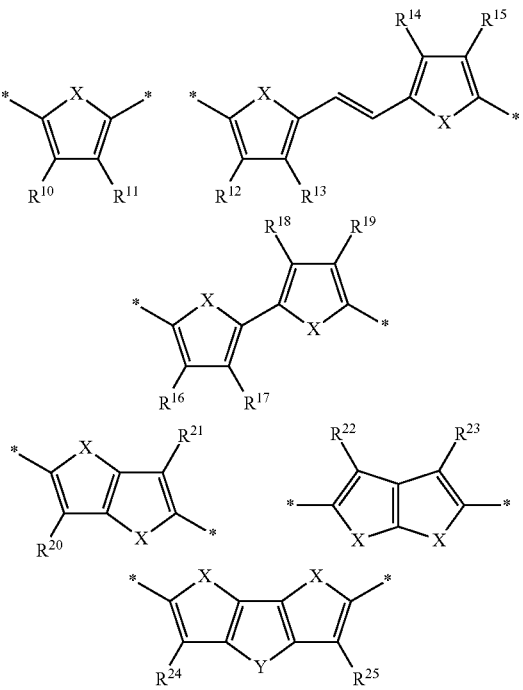

[Chemical Formula 1a]

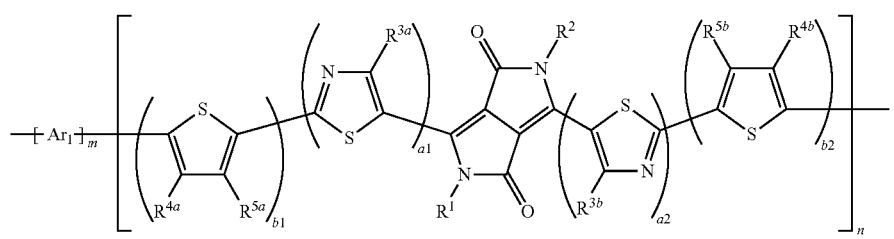

-continued

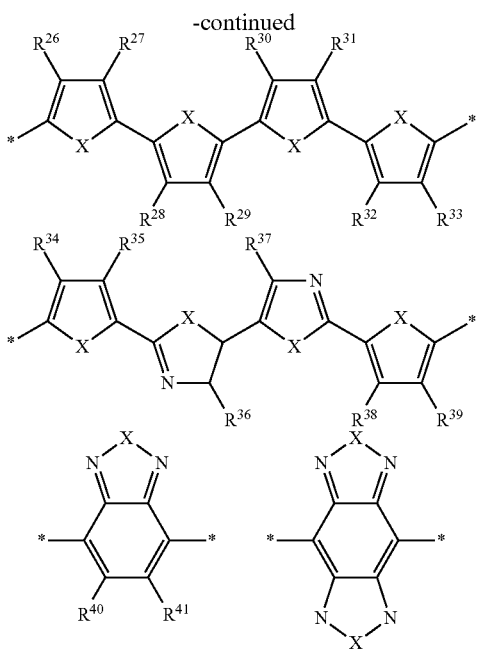

In the Group 1,

X is independently one of S and Se,

Y is one of S, Se, and $CR^aR^b$, wherein each of $R^a$ and $R^b$ are independently one of hydrogen, a substituted or unsubstituted C1 to C30 alkyl group, a halogen atom, and a combination thereof, and each of $R^{10}$ to $R^{41}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

The ratio of the m and n may be about 1:9 to about 9:1.

The mole ratio of the m and n may be about 5:5.

According to example embodiments, an organic thin film transistor includes a gate electrode, an organic semiconductor overlapping the gate electrode, and a source electrode and a drain electrode electrically connected to the organic semiconductor, wherein the organic semiconductor includes the organic semiconductor polymer including the moiety represented by the Chemical Formula 1 and a heteroaromatic moiety having at least one of sulfur (S) and selenium (Se).

According to example embodiments, an electronic device includes the organic thin film transistor of example embodiments.

The electronic device may include at least one of a liquid crystal display (LCD), an organic light emitting diode (OLED) display, an electrophoretic display device, and an organic sensor.

According to example embodiments, an electronic device includes the organic semiconductor polymer of example embodiments.

The electronic device may be at least one of a solar cell, an organic light emitting diode (OLED) display, and an organic sensor.

BRIEF DESCRIPTION OF THE DRAWING

FIG. 1 is a cross-sectional view of an organic thin film transistor according to example embodiments.

DETAILED DESCRIPTION

Example embodiments will hereinafter be described in detail, and may be more easily performed by those who have common knowledge in the related art. However, this disclosure may be embodied in many different forms, and is not construed as limited to the example embodiments set forth herein.

As used herein, when a definition is not otherwise provided, the term "substituted" refers to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the term "hetero" refers to one including 1 to 3 heteroatoms selected from N, O, S, Se, and P.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an organic semiconductor polymer according to example embodiments is described.

The organic semiconductor polymer according to example embodiments includes a moiety represented by the following Chemical Formula 1, and a heteroaromatic moiety including at least one of sulfur (S) and selenium (Se).

In the Chemical Formula 1, each of $R^1$, $R^2$, $R^{3a}$, $R^{3b}$, $R^{4a}$, $R^{4b}$, $R^{5a}$, and $R^{5b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of a1 and a2 are independently integers ranging from 1 to 5, and each of b1 and b2 are independently integers ranging from 1 to 10.

The heteroaromatic moiety may include, for example at least one selected from the following Group 1.

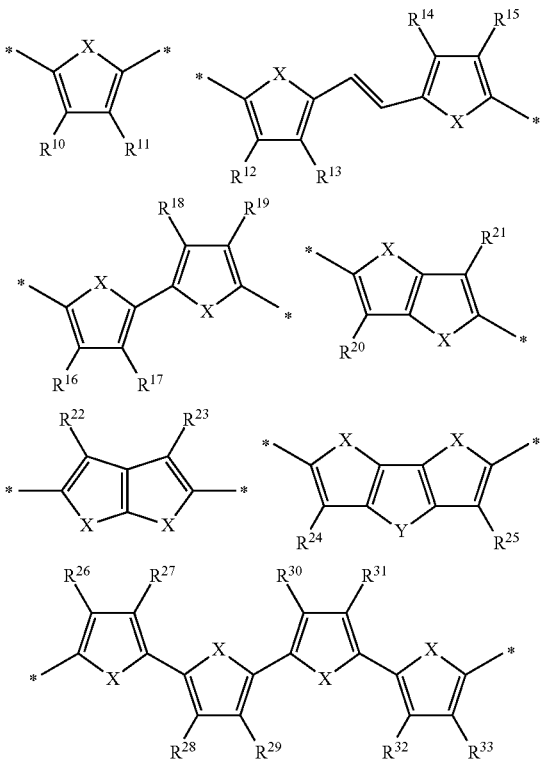

[Group 1]

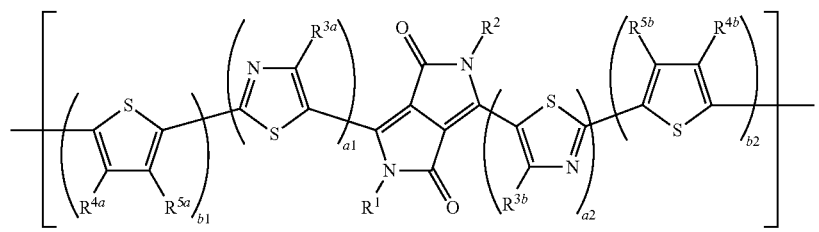

[Chemical Formula 1]

-continued

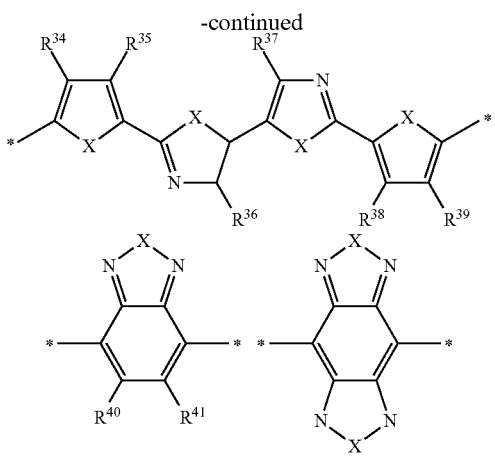

In the Group 1,

X is independently one of S and Se,

Y is one of S, Se, and $CR^aR^b$, wherein each of $R^a$ and $R^b$ are independently one of hydrogen, a substituted or unsubstituted C1 to C30 alkyl group, a halogen atom, and a combination thereof, each of $R^{10}$ to $R^{41}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

The organic semiconductor polymer includes a thiophene moiety having p-type semiconductor characteristics and a diketopyrrolopyrrole moiety having n-type semiconductor characteristics, and has bipolar characteristics and thus may have a low energy bandgap and an improved structure for high charge mobilities in a molecule and among molecules. Accordingly, the organic semiconductor polymer may show higher charge mobility and a lower leakage current. In addition, the organic semiconductor polymer may show improved solubility in a common organic solvent, and thus may be desirable for a solution process and have improved workability and thin film characteristics.

For example, in the moiety represented by the Chemical Formula 1, each of $R^{4a}$ and $R^{4b}$ may independently be hydrogen, and each of $R^1$, $R^2$, $R^{3a}$, $R^{3b}$, $R^{5a}$, and $R^{5b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

Herein, functional groups ($R^1$ and $R^2$) in the core moiety, and/or functional groups ($R^{3a}$, $R^{3b}$, $R^{5a}$, and $R^{5b}$) disposed toward the core moiety are substituted with a substituent, e.g., an alkyl group, rather than hydrogen, and thus may increase interaction among the substituents and molecule arrangements and further increase charge mobility among molecules.

For example, in the moiety represented by the Chemical Formula 1, $R^{4a}$ and $R^{4b}$ may independently be hydrogen, and each of $R^1$, $R^2$, $R^{3a}$, $R^{3b}$, $R^{5a}$, and $R^{5b}$ may independently be a substituted or unsubstituted C1 to C30 alkyl group.

For example, in the moiety represented by the Chemical Formula 1, each of $R^{4a}$ and $R^{4b}$ may independently be hydrogen, and each of $R^1$, $R^2$, $R^{3a}$, $R^{3b}$, $R^{5a}$, and $R^{5b}$ may independently be a substituted or unsubstituted C5 to C30 alkyl group.

For example, in the moiety represented by the Chemical Formula 1, each of $R^{4a}$ and $R^{4b}$ may independently be hydrogen, and each of $R^1$, $R^2$, $R^{3a}$, $R^{3b}$, $R^{5a}$, and $R^{5b}$ may independently be a substituted or unsubstituted C8 to C30 alkyl group.

The organic semiconductor polymer may include the moiety represented by the Chemical Formula 1 and the heteroaromatic moiety as repeating units in a predetermined or given ratio, and may be, for example, represented by the following Chemical Formula 1a.

[Chemical Formula 1a]

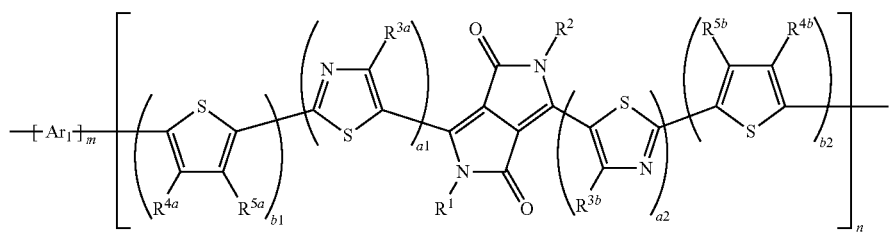

In the Chemical Formula 1a, $Ar_1$ is a heteroaromatic moiety including at least one of sulfur (S) and selenium (Se), each of $R^1$, $R^2$, $R^{3a}$, $R^{3b}$, $R^{4a}$, $R^{4b}$, $R^{5a}$, and $R^{5b}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of a1 and a2 are independently integers ranging from 1 to 5, each of b1 and b2 are independently integers ranging from 1 to 10, and m and n denote a mole ratio.

As described above, for example, in the moiety represented by the Chemical Formula 1a, each of $R^{4a}$ and $R^{4b}$ may independently be hydrogen, and each of $R^1$, $R^2$, $R^{3a}$, $R^{3b}$, $R^{5a}$, and $R^{5b}$ may independently be one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

The organic semiconductor polymer may include the moiety represented by the Chemical Formula 1 and the heteroaromatic moiety in a mole ratio of about 1:9 to about 9:1, for example, about 3:7 to about 7:3, or about 5:5.

The organic semiconductor polymer may be applied to various devices including an organic semiconductor. For example, the organic semiconductor polymer may be applied to an organic thin film transistor, and may be applied to an active layer of an electronic device, e.g., a solar cell, an organic light emitting diode (OLED) display, and an organic sensor.

Hereinafter, one example of an organic thin film transistor including the organic semiconductor polymer is described referring to the drawing.

In the drawing, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a cross-sectional view of an organic thin film transistor according to example embodiments.

A gate electrode 124 may be formed on a substrate 110 made of transparent glass, silicon, or plastic. The gate electrode 124 may be connected to a gate line (not shown) transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof.

A gate insulating layer 140 may be formed on the gate electrode 124. The gate insulating layer 140 may be made of an organic material or an inorganic material. Examples of the organic material may include a soluble polymer compound, e.g., a polyvinyl alcohol-based compound, a polyimide-based compound, a polyacryl-based compound, a polystyrene-based compound, and benzocyclobutane (BCB), and examples of the inorganic material may include a silicon nitride ($SiN_x$) and silicon oxide ($SiO_2$).

A source electrode 173 and a drain electrode 175 may be formed on the gate insulating layer 140. The source electrode 173 and the drain electrode 175 may face each other with the gate electrode 124 therebetween. The source electrode 173 is electrically connected to the data line (not shown) transferring the data signal. The source electrode 173 and the drain electrode 175 may include at least one metal selected from gold (Au), copper (Cu), nickel (Ni), aluminum (Al), molybdenum (Mo), chromium (Cr), tantalum (Ta), titanium (Ti), an alloy thereof, or a combination thereof.

An organic semiconductor 154 is formed on the source electrode 173 and the drain electrode 175. The organic semiconductor 154 may be made of the above organic semiconductor polymer. The organic semiconductor 154 may be formed in a solution process, e.g., spin coating, slit coating, or inkjet printing by preparing the above organic semiconductor polymer as a solution.

Although the bottom gate structured organic thin film transistor is illustrated as an organic thin film transistor, it is not limited thereto, and it may be applied to all organic thin film transistors, e.g., a top gate structured organic thin film transistor.

The organic thin film transistor may be applied to a switch or driving element of various electronic devices, and the electronic device may be, for example, a liquid crystal display (LCD), an organic light emitting diode (OLED) display, an eletrophoretic display device, or an organic sensor.

Hereinafter, the present disclosure is illustrated in more detail with reference to examples. However, these are examples, and the present disclosure is not limited thereto.

SYNTHESIS OF ORGANIC SEMICONDUCTOR POLYMER

Synthesis Example 1

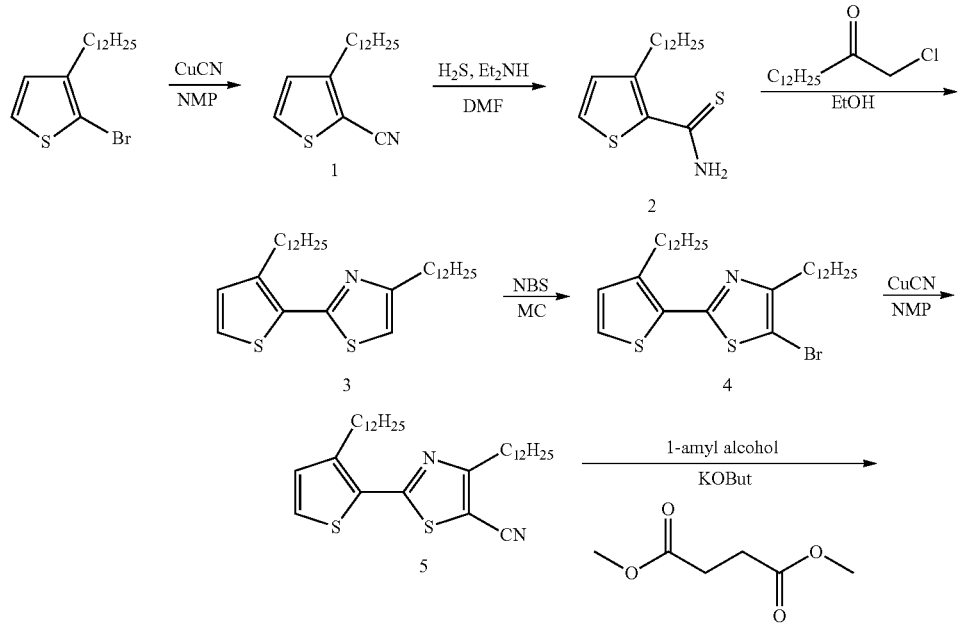

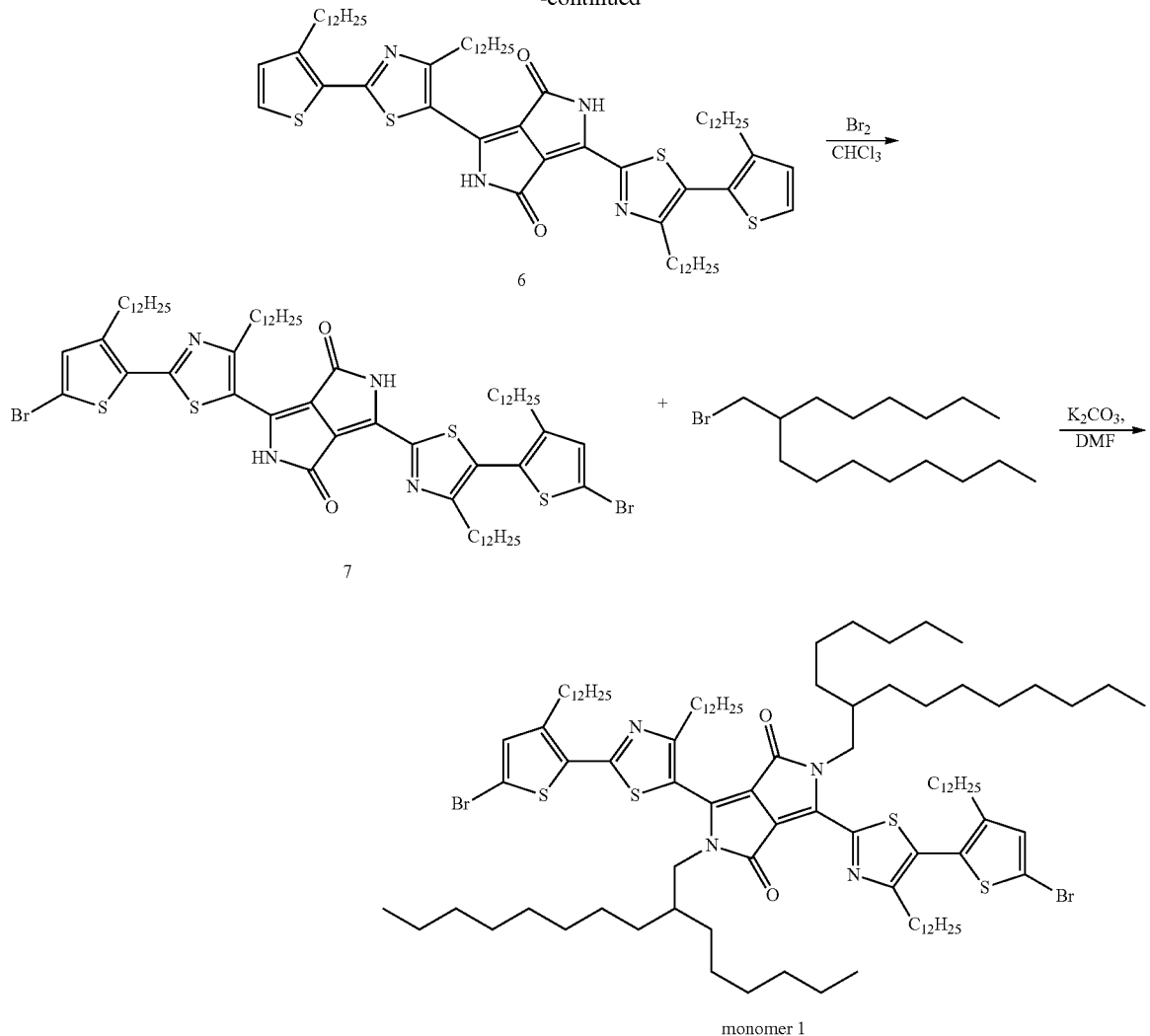

2-cyano-3-dodecylthiophene (compound 1, 71%) obtained by reacting 19.0 g (57.5 mmol) of 2-bromo-3-dodecylthiophene and 10.3 g (115.0 mmol) of copper cyanide (CuCN) and 0.1 equivalent of diethylamine are dissolved in dimethylformamide (DMF), and the solution is bubbled with $H_2S$ gas at −70° C. for about 40 minutes. Subsequently, the reactant is reacted at about 60° C. by increasing the temperature for 2 hours, extracted twice to three times with ethyl acetate and water, and then washed and dried, obtaining 2-thioamino-3-dodecylthiophene (compound 2, 88%). Subsequently, 13.5 g (43.3 mmol) of the 2-thioamino-3-dodecylthiophene is reacted with an ethanol solution including 1.2 equivalents of 1-chloro-2-butadecanone at 85° C. for 12 hours, obtaining 2-thiazole (3'-dodecyl)-3-dodecylthiophene (compound 3, 95%). The 2-thiazole (3'-dodecyl)-3-dodecylthiophene (3) is reacted with N-bromosuccinimide (NBS), obtaining a thiophene-thiazole derivative (compound 4, 91%). Subsequently, the thiophene-thiazole derivative (4) is used in a method of producing the 2-cyano-3-dodecylthiophene (1), obtaining a compound 5 (75%). Then, a mixture of 5 mg of ferric chloride ($FeCl_3$), 2.6 g of sodium, and 100 ml of t-amyl alcohol is heated at 110° C. for 20 minutes, and another mixture of compound 5 and 1.2 equivalents of di-tert-amyl succinate is added thereto in a dropwise fashion. The reaction mixture is agitated at 110° C. for 3 hours and poured on 8.15 g of acetic acid in 300 mL of water-methanol (2:1 v/v). The reactant is filtered with a Buchner funnel and thoroughly washed with methanol, obtaining a compound 6. The compound 6 is dissolved in 200 mL of chloroform, the solution is cooled down to 0° C., and another solution obtained by dissolving 2.2 equivalents of bromine in 200 mL of chloroform is added little by little to the solution over one hour. When the reaction is complete, the mixture is washed with water. An organic phase produced therein is extracted, dried, and concentrated. Subsequently, the compound is purified through a silica gel column, obtaining a 1,4-diketopyrrolo[3,4-c]pyrrole (DPP) derivative 7 (47%). The 1,4-diketopyrrolo[3,4-c] pyrrole (DPP) derivative 7, 1.5 equivalents of $K_2CO_3$, and a solution of 1.5 equivalents of 1-bromo-2-hexyl-decyl in 50 ml of DMF is heated at 140° C. for 6 hours. The mixture is then washed with water and extracted with dichloromethane. Then, the extract is purified through silica gel column chromatography and precipitation in chloroform/methanol, obtaining a desired monomer-1.

The monomer-1 has the following $^1$H-NMR data:

$^1$H-NMR (300 MHz, $CDCl_3$): 0.65-0.88 (t, 24H), 1.25 (m, 24H), 1.29-1.60 (m, 40H), 2.10 (m, 2H), 2.44 (t, 4H), 2.62 (m, 4H), 2.79-3.04 (d, 4H), 6.70 (d, 2H).

Synthesis Example 2

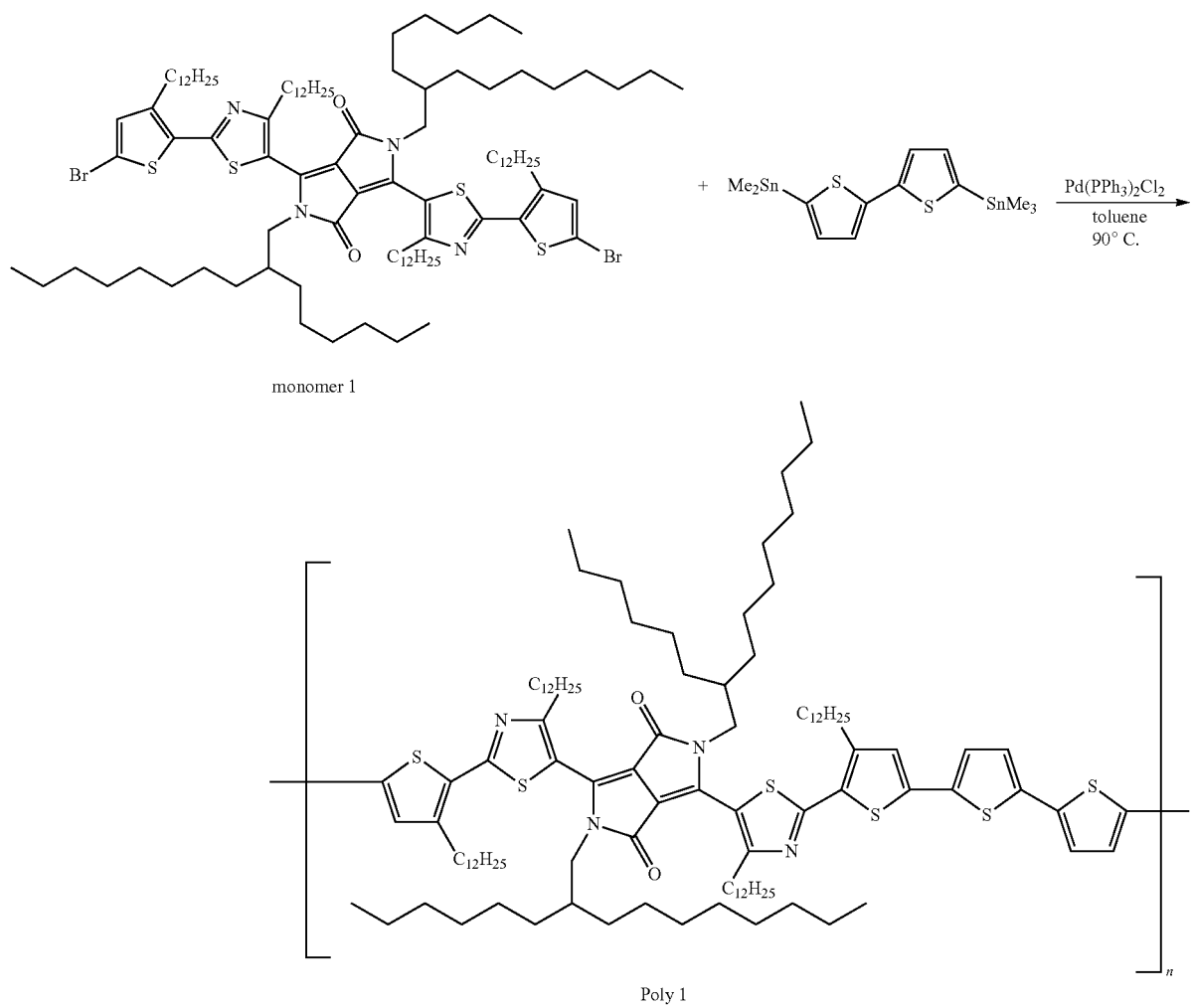

monomer 1

Poly 1

0.3 mmol of the monomer-1 obtained in Synthesis Example 1 and 0.7 equivalents of bis(trimethylstannyl)thiophene is completely dissolved in anhydrous toluene by lightly heating the mixture in a reactor under a nitrogen atmosphere. Subsequently, 10 mol % of Pd(PPh$_3$)$_4$ as a polymerization catalyst based on the monomer-1 is added thereto, and the resulting mixture is reacted at 85° C. for 5-6 hours. Herein, an end-capper in an excess amount (5 equivalents) based on the monomer-1 is added thereto, and the resulting mixture is reacted for 24 hours. After the reaction, the mixed reaction solution is cooled down to room temperature and filtered to obtain a polymer solid, and the polymer solid is washed twice with a hydrochloric acid aqueous solution/chloroform, twice with an ammonia aqueous solution/chloroform, and twice with water/chloroform in order, and then a polymer is recovered through Soxhlet extraction by using methanol, acetone, methylenechloride, and chloroform. Subsequently, the polymer is dried, obtaining polymer 1 (Poly 1). The yield of the Poly 1 is 45%, and the number average molecular weight of the Poly 1 measured through gel permeation chromatography (GPC) is 18,000.

Synthesis Example 3

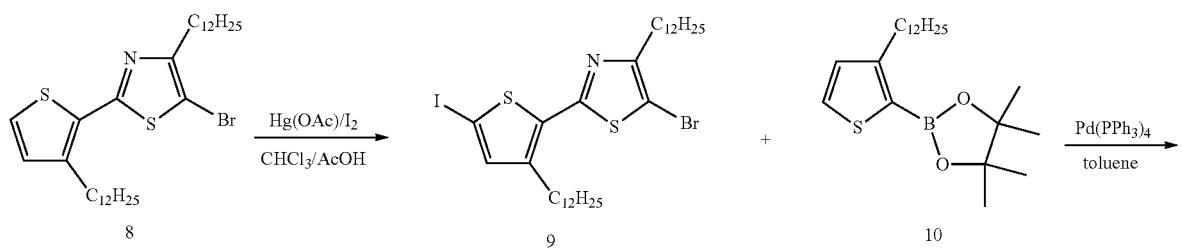

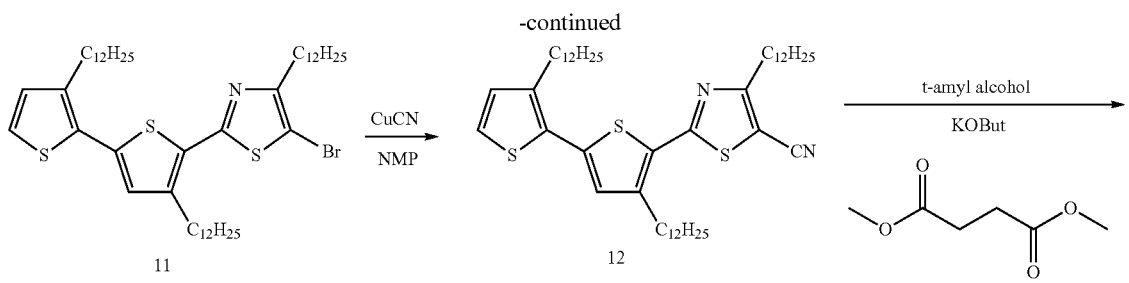
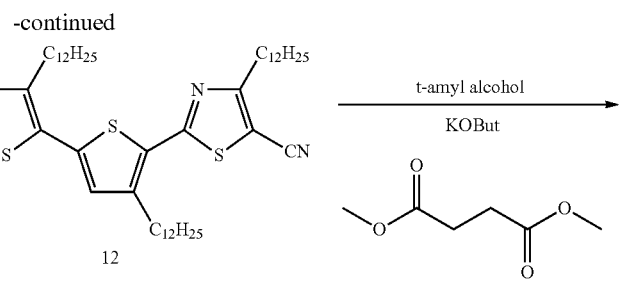
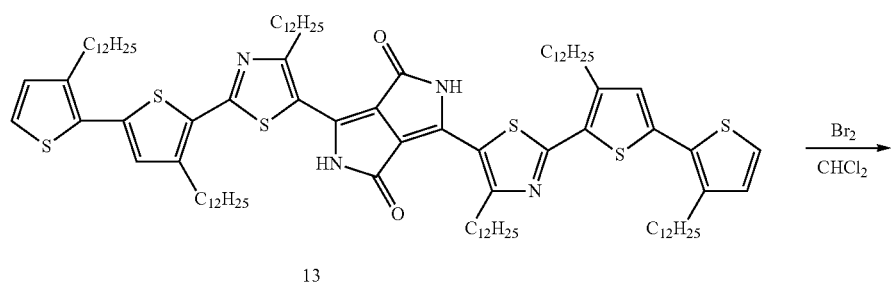
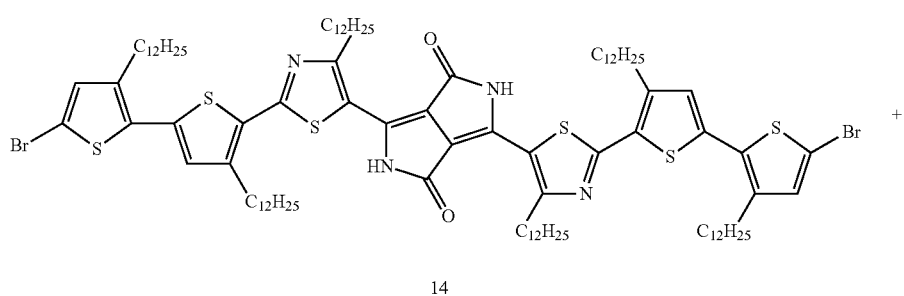
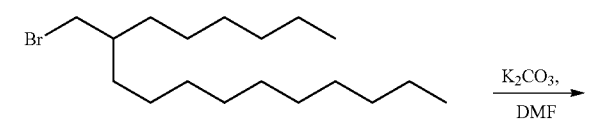
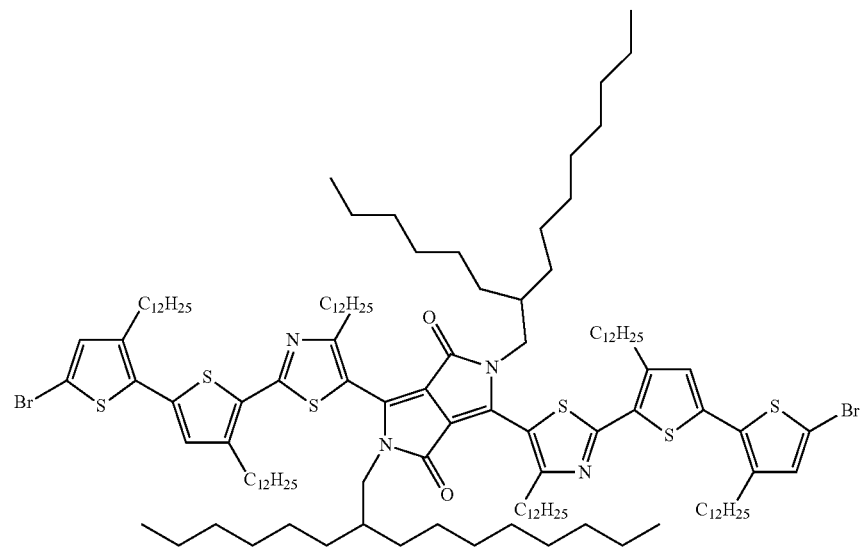
monomer 2

120 g (223 mmol) of the compound 8 is dissolved in 1 L of CHCl₃:AcOH (1:1), 0.75 equivalents of Hg(OAc)₂ is added thereto, and the mixture is agitated for 20 minutes. Subsequently, 1.25 equivalents of iodine are slowly added to the agitated mixture, and the resulting mixture is reacted for 3 hours. After the reaction, the reaction solution is filtered to remove a red precipitate, the obtained organic layer is washed with 500 ml of H₂O, 500 ml³ of a NaHCO₃ aqueous solution, 500 ml of Na₂S₂O₃, and 500 ml of brine, dried with MgSO₄, filtered, and concentrated, and then passed through and purified with a column with a hexane solvent, obtaining 90% of a compound 9. Subsequently, the compound 9 and a compound 10 are put and dissolved in 50 ml of THF, 0.14 equivalents DeletedTextsof Pd(PPh₃)₄ and 60 ml of toluene are added thereto, and the mixture is refluxed for a reaction for 24 hours. Then, 200 ml of hexane is added thereto, the mixture is washed with 100 ml of water, the obtained organic layer is dried with MgSO₄, filtered, and concentrated, and then the product is put in a 2 L round-bottomed flask and dissolved in 80 ml of CH₂Cl₂. The organic layer is then dried with MgSO₄, filtered, and concentrated, and passed through and purified with a column with a hexane/chloroform solvent, obtaining a compound 11 (yield: 27%). Subsequently, the compound 11 is reacted with copper cyanide (CuCN) in an excess amount, obtaining a compound 12. A mixture of 5 mg of ferric chloride (FeCl₃), 2.6 g of sodium, and 100 ml of t-amyl alcohol is heated at 110° C. for 20 minutes, and another mixture of the compound 12 and 1.2 equivalents of di-tert-amyl succinate are added thereto in a dropwise fashion. The reaction mixture is agitated at 110° C. for 3 hours, and then poured on 8.15 g of acetic acid in 300 mL of a mixture of water-methanol (2:1=v/v). The product is filtered through a Buchner funnel and thoroughly washed with methanol, obtaining a compound 13. The compound 13 is dissolved in 200 mL of chloroform, the solution is cooled down to 0° C., and another solution prepared by dissolving 2.2 equivalents of bromine in 200 mL of chloroform is added little by little thereto for 1 hour. When the reaction is complete, the mixture is washed with water, and the obtained organic phase is extracted, dried, and concentrated. The compound is purified through a silica gel column, obtaining a compound 14 (45%). Then, the compound 14, 1.5 equivalents of K₂CO₃, and a solution of 1.5 equivalents of 1-bromo-2-hexyl-decyl in 50 ml of DMF are heated at 140° C. for 6 hours. The mixture is washed with water and extracted with dichloromethane. The extract is purified through silica gel column chromatography and precipitation in chloroform/methanol, obtaining a desired monomer-2.

The monomer-2 has the following ¹H-NMR data:

¹H-NMR (300 MHz, CDCl₃): 0.65-0.88 (t, 30H), 1.25 (m, 24H), 1.29-1.60 (m, 80H), 2.10 (m, 2H), 2.44 (t, 4H), 2.62 (m, 8H), 2.79-3.04 (d, 4H), 6.70 (d, 2H).

Synthesis Example 4

[Reaction Scheme 4]

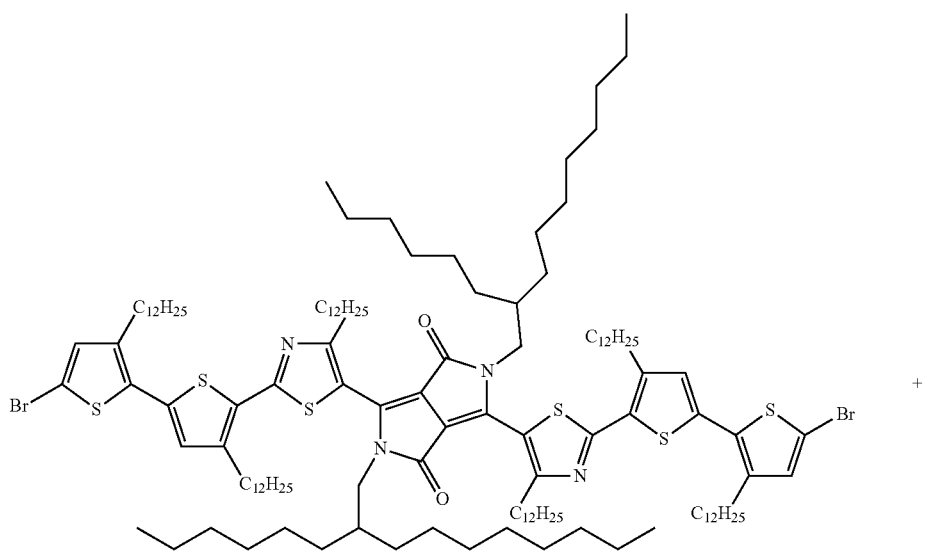

monomer 2

+

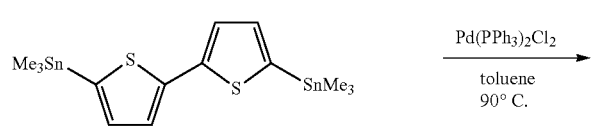

-continued

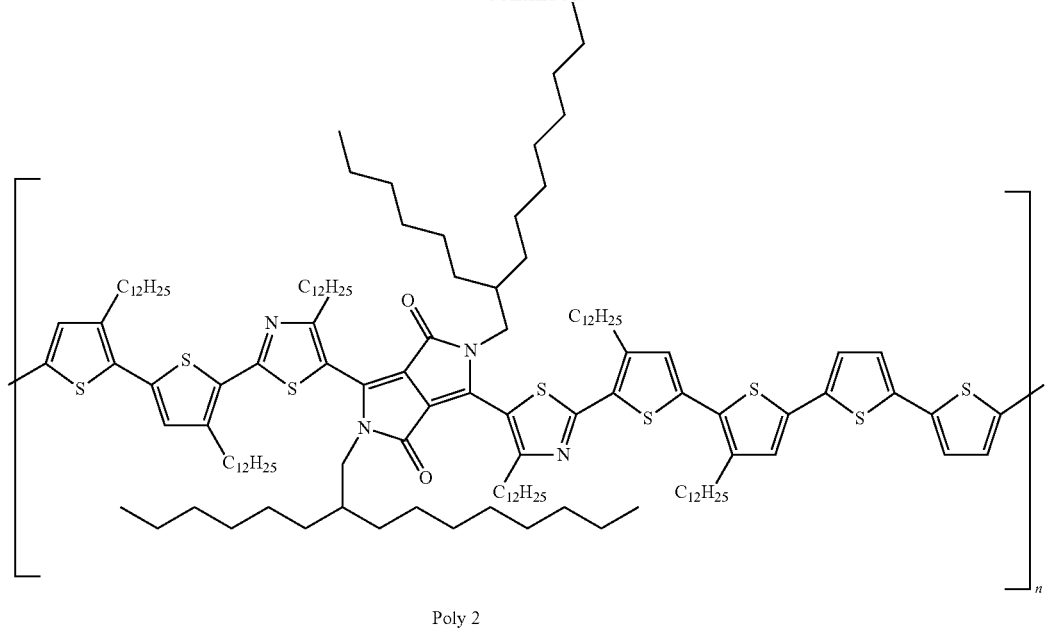

Poly 2

0.29 mmol of the monomer-2 obtained according to Example 3 and 0.7 equivalents of bis(trimethylstannyl)thiophene are put in a reactor under a nitrogen atmosphere and lightly heated to completely dissolve them in anhydrous toluene. Subsequently, 10 mol % of Pd(PPh$_3$)$_4$ as a polymerization catalyst relative to the monomer-2 is added thereto, and the mixture is reacted at 85° C. for 5-6 hours. Herein, an end-capper in an excess amount (5 equivalents) based on the monomer-2 is added thereto, and the mixture is reacted for 24 hours. After the reaction, the mixed reaction solution is cooled down to room temperature and filtered to obtain a polymer solid, the polymer solid is washed twice with a hydrochloric acid aqueous solution/chloroform, twice with an ammonia aqueous solution/chloroform, and twice with water/chloroform in order, and then a polymer is recovered by performing Soxhlet extraction with methanol, acetone, methylene chloride, and chloroform. Subsequently, the polymer is dried, obtaining polymer 2 (Poly 2). The yield of the Poly 2 is 47%, and the number average molecular weight of the Poly 2 measured through gel permeation chromatography (GPC) is 20,000.

Manufacture of Organic Thin Film Transistor

Example 1

First, chromium is sputtered to deposit a 1000 Å-thick gate electrode on a washed glass substrate, and SiO$_2$ is deposited to form a 1000 Å-thick gate insulating layer in a CVD method. Subsequently, ITO is sputtered to deposit a 1200 Å-thick source-drain electrode thereon. The substrate is washed with isopropyl alcohol for 10 minutes and dried before depositing an organic semiconductor. Subsequently, the polymer 1 according to Synthesis Example 2 is dipped in an octadecyltrichlorosilane solution diluted in chloroform in a concentration of 10 mM for 30 seconds, washed with acetone, and dried. The dried polymer 1 in a concentration of 1 wt % is dissolved in chloroform to prepare an organic semiconductor solution, and the organic semiconductor solution is spin-coated to be 1000 Å thick at 1000 rpm. The coated substrate is then baked at 100° C. for 1 hour under an argon atmosphere, manufacturing an organic thin film transistor.

Example 2

An organic thin film transistor is manufactured according to the same method as Example 1, except for using the polymer 2 according to Synthesis Example 4 instead of the polymer 1 according to Synthesis Example 2.

Comparative Example 1

An organic-thin film transistor is manufactured according to the same method as Example 1, except for using polyhexylthiophene (P$_3$HT, Sigma-Aldrich Co. Ltd.) instead of the polymer 1 according to Synthesis Example 2.

Evaluation

Charge mobility and current on/off ratio ($I_{on}/I_{off}$) of the organic thin film transistors according to Examples 1 and 2 and Comparative Example 1 are calculated.

The charge mobility of the organic thin film transistors is obtained by obtaining a graph having $(I_{SD})^{1/2}$ and $V_G$ as variables from a saturation region current formula and a slope in the graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above Chemical Formula, $I_{SD}$ is a source-drain current, m or m$_{FET}$ is charge mobility, $C_0$ is electrostatic capacity of a gate insulating layer, W is a channel width, L is a channel length, $V_G$ is a gate voltage, and $V_T$ is a threshold voltage.

A cut-off leakage current ($I_{off}$) is obtained as a minimum current in an off state as a current flowing in an off state. A current on-off ratio ($I_{on}/I_{off}$) is obtained as a ratio of a maximum current in an on state relative to a minimum current in the off state.

The results are provided in Table 1.

TABLE 1

|  | Charge mobility (cm²/Vs) | Current on/off ratio ($I_{on}/I_{off}$) |
|---|---|---|
| Example 1 | 0.17 | $1 \times 10^4$ |
| Example 2 | 0.23 | $3 \times 10^4$ |
| Comparative Example 1 | 0.045 | $1 \times 10^3$ |

Referring to Table 1, the organic thin film transistors according to Examples 1 and 2 showed improved charge mobility and current on/off ratio compared with the organic thin film transistor according to Comparative Example 1.

While this disclosure has been described in connection with what is presently considered to be practical example embodiments, it is to be understood that the present disclosure is not limited to the disclosed embodiments, but, on the contrary, is intended to cover various modifications and equivalent arrangements included within the spirit and scope of the appended claims.

What is claimed is:

1. An organic semiconductor polymer, comprising
a moiety represented by the following Chemical Formula 1 and a heteroaromatic moiety having at least one of sulfur (S) and selenium (Se):

[Chemical Formula 1]

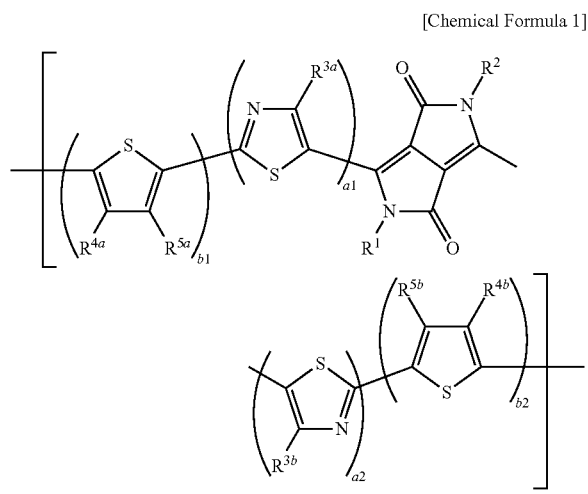

wherein, in the Chemical Formula 1,
each of $R^1$, $R^2$, $R^{4a}$, $R^{4b}$, $R^{5a}$, and $R^{5b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof,
each of $R^{3a}$ and $R^{3b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof,
each of a1 and a2 are independently integers ranging from 1 to 5, and
each of b1 and b2 are independently integers ranging from 1 to 10.

2. The organic semiconductor polymer of claim 1, wherein the heteroaromatic moiety comprises at least one selected from the following Group 1:

[Group 1]

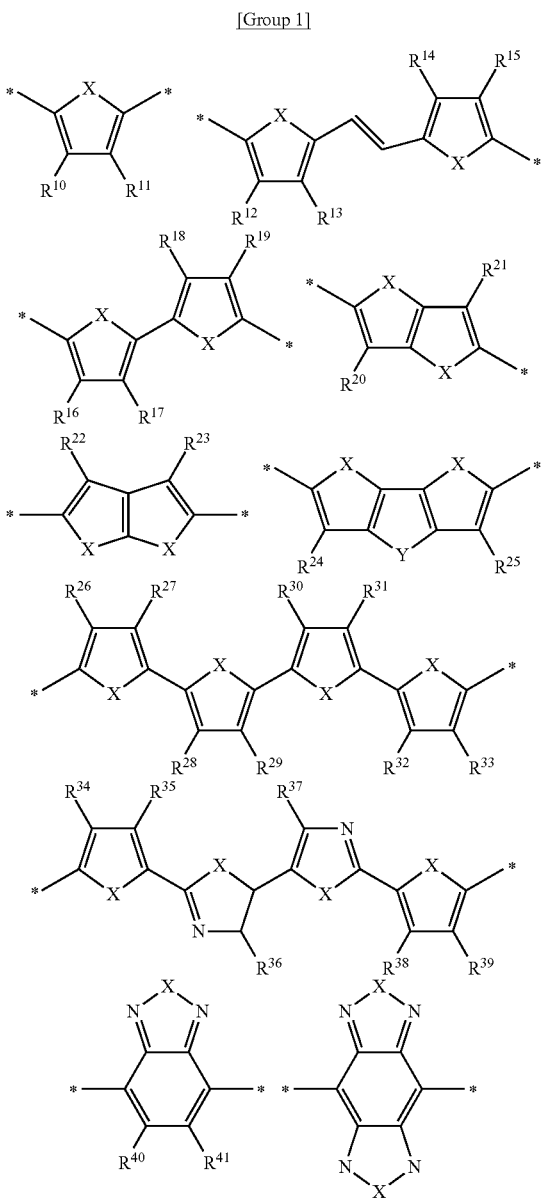

wherein, in the Group 1,
X is independently one of S and Se,
Y is one of S, Se, and $CR^aR^b$, wherein each of $R^a$ and $R^b$ are independently one of hydrogen, a substituted or unsubstituted C1 to C30 alkyl group, a halogen atom, and a combination thereof, and
each of $R^{10}$ to $R^{41}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

3. The organic semiconductor polymer of claim 1, wherein each of $R^{4a}$ and $R^{4b}$ are independently hydrogen, and each of $R^1$, $R^2$, $R^{3a}$, $R^{3b}$, $R^{5a}$, and $R^{5b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

4. The organic semiconductor polymer of claim 1, wherein the organic semiconductor polymer is represented by the following Chemical Formula 1a:

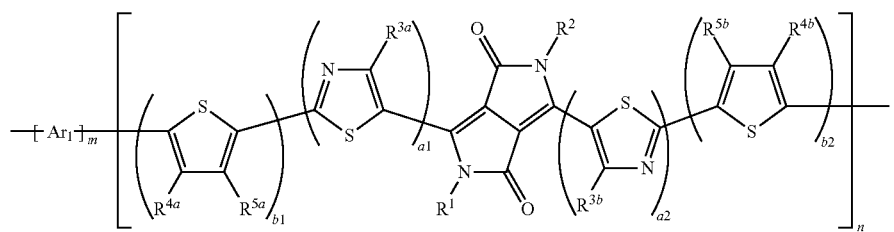

wherein, in the Chemical Formula 1a,
$Ar_1$ is a heteroaromatic moiety including at least one of sulfur (S) and selenium (Se),
each of $R^1$, $R^2$, $R^{4a}$, $R^{4b}$, $R^{5a}$, and $R^{5b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof,
each of $R^{3a}$ and $R^{3b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof,
each of a1 and a2 are independently integers ranging from 1 to 5,
each of b1 and b2 are independently integers ranging from 1 to 10, and
m and n denote a mole ratio.

5. The organic semiconductor polymer of claim 4, wherein the $Ar_1$ comprises at least one selected from the following Group 1:

[Group 1]

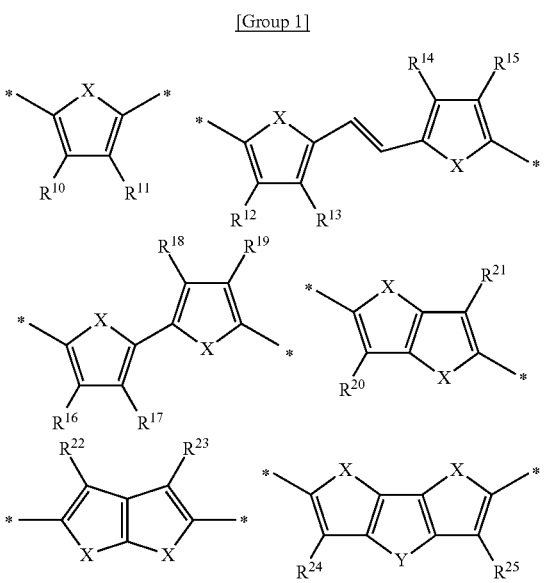

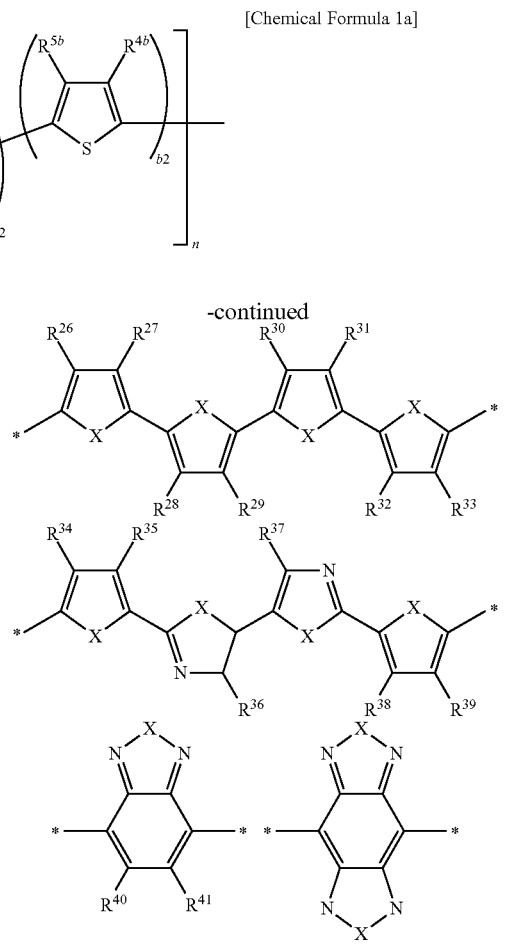

wherein, in the Group 1,
X is one of S and Se,
Y is one of S, Se, and $CR^aR^b$, wherein each of $R^a$ and $R^b$ are independently one of hydrogen, a substituted or unsubstituted C1 to C30 alkyl group, a halogen atom, and a combination thereof, and each of $R^{10}$ to $R^{41}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

6. The organic semiconductor polymer of claim 4, wherein each of $R^{4a}$ and $R^{4b}$ are independently hydrogen, and each of $R^1$, $R^2$, $R^{3a}$, $R^{3b}$, $R^{5a}$, and $R^{5b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

7. The organic semiconductor polymer of claim 4, wherein the mole ratio of m and n is about 1:9 to about 9:1.

8. The organic semiconductor polymer of claim 7, wherein the mole ratio of m and n is about 5:5.

9. An organic thin film transistor, comprising:
a gate electrode;
an organic semiconductor overlapping the gate electrode; and
a source electrode and a drain electrode electrically connected to the organic semiconductor,
the organic semiconductor including a moiety represented by the following Chemical Formula 1 and a heteroaromatic moiety having at least one of sulfur (S) and selenium (Se):

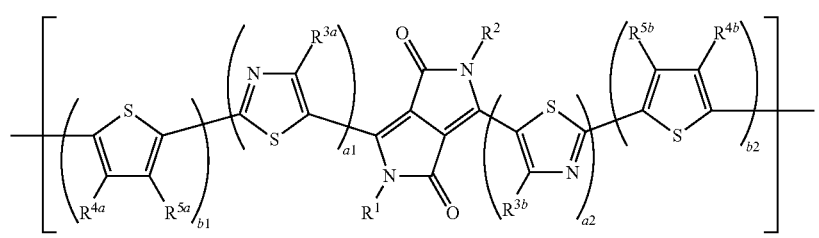

[Chemical Formula 1]

wherein, in the Chemical Formula 1,
each of $R^1$, $R^2$, $R^{4a}$, $R^{4b}$, $R^{5a}$, and $R^{5b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of $R^{3a}$ and $R^{3b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of a1 and a2 are independently integers ranging from 1 to 5, and each of b1 and b2 are independently integers ranging from 1 to 10.

10. The organic thin film transistor of claim 9, wherein the heteroaromatic moiety comprises at least one selected from the following Group 1:

[Group 1]

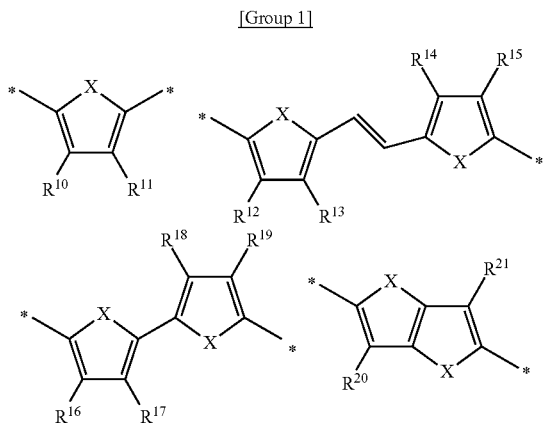

-continued

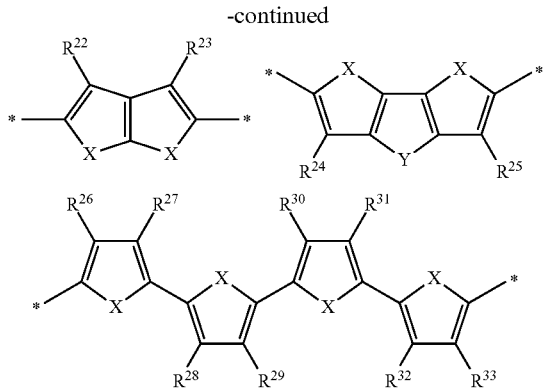

-continued

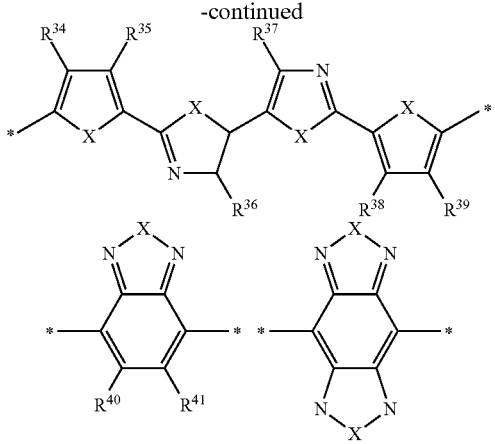

wherein, in the Group 1,

X is independently one of S and Se,

Y is one of S, Se, and $CR^aR^b$, wherein each of $R^a$ and $R^b$ are independently one of hydrogen, a substituted or unsubstituted C1 to C30 alkyl group, a halogen atom, and a combination thereof, and each of $R^{10}$ to $R^{41}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

11. The organic thin film transistor of claim 10, wherein each of $R^{4a}$ and $R^{4b}$ are independently hydrogen, and each of $R^1$, $R^2$, $R^{3a}$, $R^{3b}$, $R^{5a}$, and $R^{5b}$ are independently one of a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

12. The organic thin film transistor of claim 10, wherein the organic semiconductor polymer is represented by the following Chemical Formula 1a:

wherein, in the Chemical Formula 1a, $Ar_1$ is a heteroaromatic moiety including at least one of sulfur (S) and selenium (Se), each of $R^1$, $R^2$, $R^{4a}$, $R^{4b}$, $R^{5a}$, and $R^{5b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of $R^{3a}$ and $R^{3b}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof, each of a1 and a2 are independently integers ranging from 1 to 5, each of b1 and b2 are independently integers ranging from 1 to 10, and m and n denote a mole ratio.

13. The organic thin film transistor of claim 12, wherein the $Ar_1$ comprises at least one selected from the following Group 1:

[Group 1]

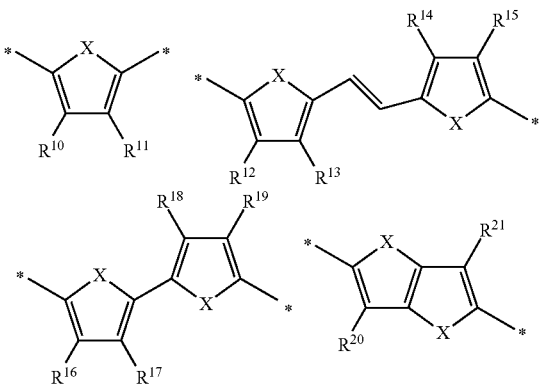

[Chemical Formula 1a]

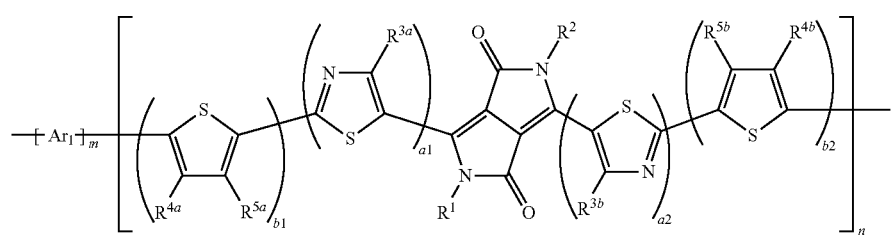

-continued

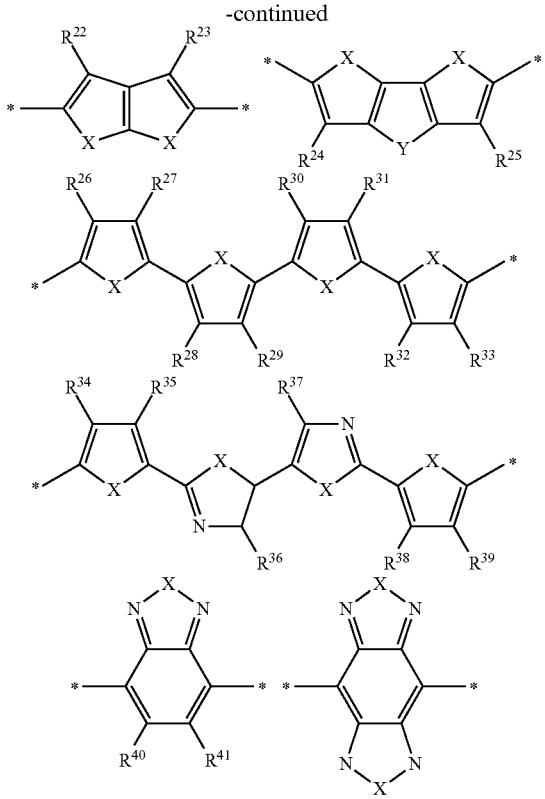

wherein, in the Group 1,

X is independently one of S and Se,

Y is one of S, Se, and $CR^aR^b$, wherein each of $R^a$ and $R^b$ are independently one of hydrogen, a substituted or unsubstituted C1 to C30 alkyl group, a halogen atom, and a combination thereof, and $R^{10}$ to $R^{41}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

14. The organic thin film transistor of claim 12, wherein $R^{4a}$ and $R^{4b}$ are independently hydrogen, and each of $R^1$, $R^2$, $R^{3a}$, $R^{3b}$, $R^{5a}$, and $R^{5b}$ are independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a hydroxy group, a halogen atom, and a combination thereof.

15. The organic thin film transistor of claim 12, wherein the mole ratio of m and n is about 1:9 to about 9:1.

16. The organic thin film transistor of claim 15, wherein the mole ratio of m and n is about 5:5.

17. An electronic device comprising the organic thin film transistor according to claim 9.

18. The electronic device of claim 17, wherein the electronic device comprises at least one of a liquid crystal display (LCD), an organic light emitting diode (OLED) display, an electrophoretic display device, and an organic sensor.

19. An electronic device comprising the organic semiconductor polymer according to claim 1.

20. An electronic device of claim 19, wherein the electronic device comprises at least one of a solar cell, an organic light emitting diode (OLED) display, and an organic sensor.

* * * * *